United States Patent
Varnica et al.

(10) Patent No.: US 10,200,064 B1
(45) Date of Patent: Feb. 5, 2019

(54) SYSTEMS AND METHOD FOR BIT-FLIPPING DECODERS WITH PARTIAL-COLUMN PROCESSING, ORDERING AND SCHEDULING

(71) Applicant: Marvell International Ltd., Hamilton (BM)

(72) Inventors: Nedeljko Varnica, San Jose, CA (US); Viet-Dzung Nguyen, San Jose, CA (US); Shashi Kiran Chilappagari, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 429 days.

(21) Appl. No.: 14/662,159

(22) Filed: Mar. 18, 2015

Related U.S. Application Data

(60) Provisional application No. 61/955,091, filed on Mar. 18, 2014.

(51) Int. Cl.
H03M 13/00 (2006.01)
H03M 13/13 (2006.01)
H03M 13/11 (2006.01)

(52) U.S. Cl.
CPC .... *H03M 13/1108* (2013.01); *H03M 13/1131* (2013.01); *H03M 13/616* (2013.01)

(58) Field of Classification Search
None
See application file for complete search history.

(56) References Cited

U.S. PATENT DOCUMENTS

| | | | |
|---|---|---|---|
| 6,457,147 B1 | 9/2002 | Williams | |
| 6,642,862 B2 | 11/2003 | Boudry | |
| 7,441,178 B2 | 10/2008 | Xin | |
| 8,155,247 B2 | 4/2012 | Koorapaty et al. | |
| 8,347,194 B2 | 1/2013 | No et al. | |
| 8,458,536 B2 | 6/2013 | Yang | |
| 8,751,912 B1* | 6/2014 | Varnica | H03M 13/036 714/785 |
| 8,756,479 B2* | 6/2014 | Varnica | H03M 13/1108 714/752 |
| 2011/0246862 A1 | 10/2011 | Graef | |
| 2014/0089757 A1* | 3/2014 | Yang | H03M 13/112 714/752 |
| 2014/0223255 A1* | 8/2014 | Lu | G06F 11/1068 714/758 |

OTHER PUBLICATIONS

U.S. Appl. No. 13/673,371, filed Nov. 9, 2012.

* cited by examiner

*Primary Examiner* — Justin R Knapp

(57) ABSTRACT

Systems and methods for performing a parity check on encoded data are disclosed. Encoded data is received. A parity check is performed based on a parity check matrix. In response to determining the first parity check is successful, a parity check number is incremented. Additional parity checks are selectively performed on subsequent portions of the array based on comparing the incremented parity check number to a threshold.

18 Claims, 7 Drawing Sheets

100

102 — V :  V1, V2, V3, V4, V5, V6

104 — C1 = V1 ⊕ V2 ⊕ V3

106 — C2 = V3 ⊕ V4 ⊕ V6

108 — C3 = V2 ⊕ V4 ⊕ V5

110 — C4 = V1 ⊕ V5 ⊕ V6

150

$$\begin{bmatrix} 1 & 1 & 1 & 0 & 0 & 0 \\ 0 & 0 & 1 & 1 & 0 & 1 \\ 0 & 1 & 0 & 1 & 1 & 0 \\ 1 & 0 & 0 & 0 & 1 & 1 \end{bmatrix}$$

154, 156, 158, 160

SYSTEMS AND METHOD FOR BIT-FLIPPING DECODERS WITH PARTIAL-COLUMN PROCESSING, ORDERING AND SCHEDULING

CROSS REFERENCE TO RELATED APPLICATION

This application claims the benefit of U.S. Provisional Application No. 61/955,091, filed Mar. 18, 2014, which is hereby incorporated by reference.

FIELD OF USE

This disclosure relates to performing partial-column processing, ordering, and scheduling for decoding of encoded data.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

Low-density parity check (LDPC) codes are used to encode data for transmission over a noisy channel. The encoded data is transmitted over a noisy channel and received by a decoder. The decoder uses an LDPC parity check matrix to decode the received data. The LDPC parity check matrix relates variable nodes containing the data to check nodes containing parity check results. The LDPC parity check matrix can be arranged in blocks, such that the parity check matrix has block columns and block rows. In some examples, these blocks are circulant block matrices.

In some LDPC parity check matrices, each column is associated with a variable node, and each row is associated with a check node. In some LPDC decoding schemes, the decoder processes each block having non-zero elements when determining whether to flip one or more bits associated with the variable node of the block column associated with that particular block.

SUMMARY

In accordance with an embodiment of the present disclosure, systems and methods are provided for performing a parity check on encoded data. The encoded data is received, and the data comprises a plurality of data symbols and a plurality of parity check symbols. Based on a parity check matrix associated with the plurality of parity check symbols, a first parity check is performed on a first portion of an array of a dimension of the parity check matrix. In response to determining the first parity check is successful, a parity check number that is associated with the array is incremented. Additional parity checks are selectively performed on subsequent portions of the array based on comparing the incremented parity check number to a threshold.

In some examples, the array is a first array, and during a same clock cycle as the first parity check, a second parity check is performed on a second portion of a second array of the dimension.

In some examples, the first portion is associated with a plurality of check nodes.

In some examples, selectively performing additional parity checks comprises, in response to comparing the incremented parity check number to the threshold, determining not to perform additional parity checks on subsequent portions of the first array. In some examples, in response to comparing the incremented parity check number to the threshold, it is determined not to change a value of a data symbol of the plurality of data symbols, the data symbol being associated with the first array.

In some examples, in response to comparing the incremented parity check number to the threshold, it is determined to perform additional parity checks on subsequent portions of the array. In some examples, based on the additional parity checks, it is determined to change a value of a data symbol of the plurality of data symbols, the data symbol being associated with the array. In some examples, in response to determining to change the value of the data symbol, an index corresponding to the array is stored in a buffer.

In some examples, a system performs a parity check on encoded data. The system can comprise control circuitry configured to receive the encoded data, and the data comprises a plurality of data symbols and a plurality of parity check symbols. The control circuitry can be further configured to perform, based on a parity check matrix associated with the plurality of parity check symbols, a first parity check on a first portion of an array of a dimension of the parity check matrix. The control circuitry can be further configured to, in response to determining the first parity check is successful, increment a parity check number that is associated with the first array. The control circuitry can be further configured to selectively perform additional parity checks on subsequent portions of the array based on comparing the incremented parity check number to a threshold.

In some examples, the array is a first array and the control circuitry is further configured to perform, during a same clock cycle as the first parity check, a second parity check on a second portion of a second array of the dimension.

In some examples, the control circuitry is further configured to select the second portion of the second array such that a first check node associated with the first portion is different from a second check node associated with the second portion.

In some examples, the control circuitry is configured to store the parity check number in a buffer, perform a third parity check on a third portion of the first array, in response to determining the third parity check is successful, increment the parity check number, and store the incremented parity check number in the buffer.

In some examples, the first portion is associated with a plurality of check nodes.

In some examples, the control circuitry is further configured to selectively perform additional parity checks by, in response to comparing the incremented parity check number to the threshold, determining not to perform additional parity checks on subsequent portions of the first array. The control circuitry can be further configured to, in response to comparing the incremented parity check number to the threshold, determining not to change a value of a data symbol of the plurality of data symbols, the data symbol being associated with the first array.

In some examples, the control circuitry is further configured to, in response to comparing the first parity check number to the first threshold, determine to perform additional parity checks on subsequent portions of the first block. The control circuitry can be further configured to, based on the additional parity checks, determine to change a value of a first of the plurality of data symbols, the first data symbol being associated with the first block. The control circuitry can be further configured to, in response to determining to change the value of the first data symbol, store an index corresponding to the first block in a buffer.

DETAILED DESCRIPTION

To provide an overall understanding of the disclosure, certain illustrative implementations will now be described, including a system for performing partial-column processing, ordering, and scheduling for bit-flipping decoders. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope thereof.

The systems and methods described herein can improve processing in bit-flipping (BF) decoders by reducing the number of clock cycles required for performing parity checks using a low-density parity check (LDPC) code. By reducing the number of clock cycles required for parity checks, the systems and methods described herein can provide increased decoding throughput, more decoding iterations for a given throughput, or a smaller hardware footprint for a given throughput and number of decoding iterations. The systems and methods described herein can also reduce the power required to perform decoding operations.

Figures 1, 2:
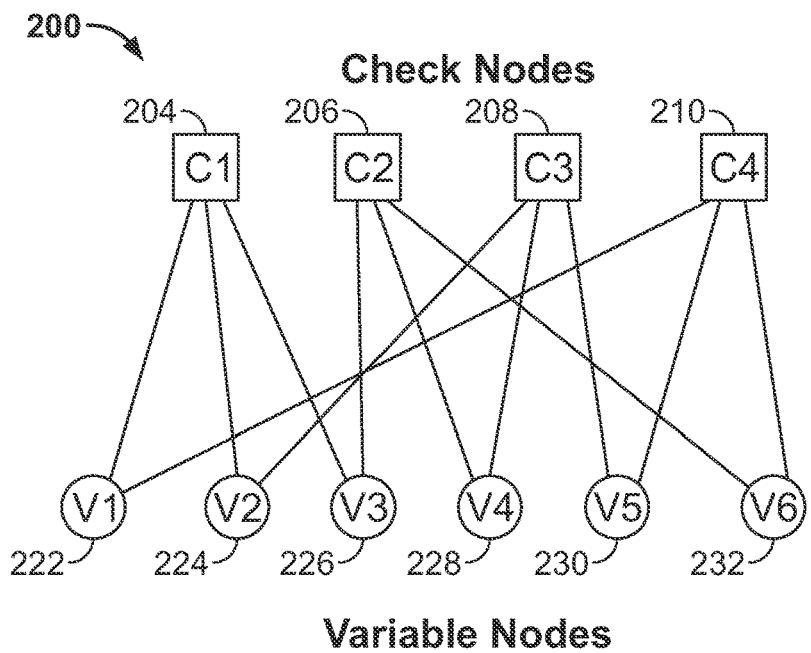
FIG. 1 depicts an LDPC encoding scheme and a corresponding LDPC parity check matrix, using an implementation of this disclosure.
FIG. 2 depicts a bipartite graph representing an encoding scheme and an LDPC matrix, according to an implementation of this disclosure.

FIG. 1 depicts an LDPC encoding scheme 100 and a corresponding LDPC parity check matrix 150. The LDPC encoding scheme 100 includes a set of variables 102 and a set of parity check equations 104, 106, 108, and 110. The set of variables 102 includes six variables V1, V2, V3, V4, V5, and V6. Each of these variables may be one or more symbols, one or more bytes, or one or more bits. The parity check equations 104, 106, 108, and 110 are used to generate check bits C1, C2, C3, and C4 to provide error detection and correction when transmitting the set of variables 102 over a noisy channel. The parity check equation 104 generates a check bit C1 by computing a modulo two sum of V1, V2, and V3. The parity check equation 106 generates a check bit C2 by computing a modulo two sum of V3, V4, and V6. Addition modulo two can be implemented in hardware with an exclusive or (XOR) operation. The parity check equation 108 generates a check bit C3 by computing a modulo two sum of V2, V4, and V5. The parity check equation 110 generates a check bit C4 by computing a modulo two sum of V1, V5 and V6. The check bits C1, C2, C3, and C4 are described herein as bits, but each check bit can represent one or more symbols, one or more bytes, or one or more bits.

The design of the parity check code requires that the values of C1, C2, C3, and C4 are each zero. If a decoder computes that a value of a check bit is non-zero, then the decoder can determine that an error has occurred and can attempt to correct the error. The encoding scheme 100 represents one example of a LDPC scheme, but the systems and methods described herein can be configured for use in any LDPC scheme.

The LDPC matrix 150 represents the LDPC scheme 100. The LDPC matrix 150 includes four rows 154, 156, 158, and 160, which correspond to the parity check equations 104, 106, 108, and 110, respectively. The LDPC matrix 150 has one row for each parity check equation, and one column for each variable in the encoded data 102. Each column in the LDPC matrix 150 may correspond to a variable in the encoded data 102. For example, the first column of the LDPC matrix 150 corresponds to the first variable in the encoded data 102. For each row of the LDPC matrix 150, the row is populated with ones in columns which correspond to variables represented in the associated parity check equation, and the row is populated with zeros in columns corresponding to variables not represented in the associated parity check equation. For example, the first parity check equation 104 computes a modulo two sum of the first three variables in the encoded data 103. Accordingly, the first row 154 of the LDPC matrix 150 includes ones in the first three columns and zeros in the remaining columns. The rows 156, 158, and 160 are populated with zeros and ones in a similar manner. The LDPC matrix 150 is depicted as a bit-wise matrix, but the elements of the LDPC matrix 150 can themselves be sub-matrices, or blocks. Such blocks can be circulants, which are matrices which have rows that are cyclic permutations of each other. Circulants can allow significant efficiencies and processing of LDPC parity check matrices. LDPC matrices are referred to low-density because the majority of elements in LDPC matrices are zeros. This low density is not apparent in the relatively small LDPC matrix 150, but becomes apparent for larger LDPC matrices. For example, circulant sub-matrix can include 100 rows and 100 columns, and an LDPC matrix can include 400 or more columns of circulant sub-matrices and correspondingly large numbers of rows of circulant sub matrices.

A decoder can process received encoded data in blocks. Blocks can be arranged along a dimension of a LDPC matrix. In the examples depicted in FIG. 1, each block has a size of one, meaning that each block contains one row and one column. The first block column in the LDPC matrix 150 contains four blocks.

Figure 3:
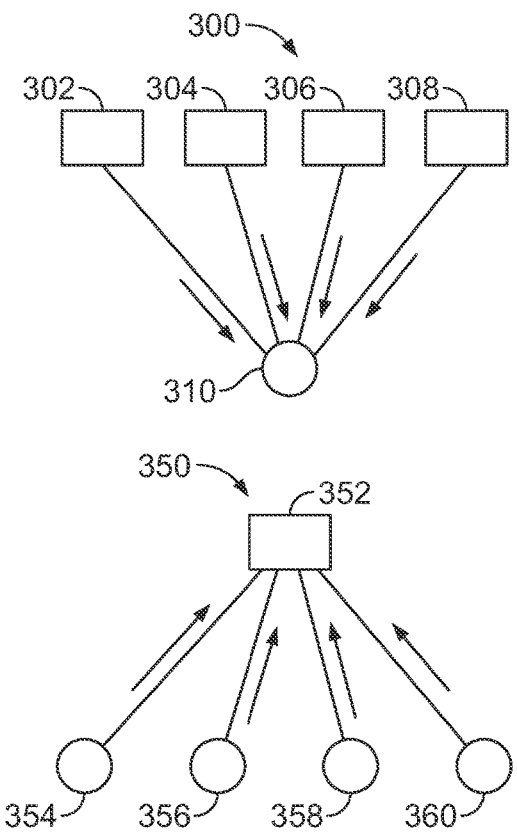
FIG. 3 depicts two subsets of a bipartite graph, according to an implementation of this disclosure.

FIG. 2 depicts a bipartite graph 200 representing the LDPC scheme 100 and the LDPC matrix 150. The bipartite graph 200 includes four check nodes, 204, 206, 208, and 210, corresponding to the parity check equations 104, 106, 108, and 110, respectively. A check node can also be referred to as a syndrome node. A syndrome is an output of a decoder and contains information associated with an outcome of a parity check. Accordingly, each of the check nodes 204, 206, 208, and 210 correspond to rows 154, 156, 158, and 160, respectively, of the LDPC matrix 150. In FIGS. 2 and 3, check nodes are represented by squares and variable nodes are represented by circles.

The bipartite graph 200 also includes six variables nodes 222, 224, 226, 228, 230, and 232, each respectively corresponding to a variable in the encoded data V102. Furthermore, each of the variable nodes 222, 224, 226, 228 and 230 corresponds to a block column of the matrix 150. The check nodes 204, 206, 208, and 210 each contain information about the state of a check bit. The variable nodes 222, 224, 226, 228, 230, and 232 each contain information corresponding to the state of one or more variable nodes. A variable node may also be referred to as a bit node. In the bipartite graph 200, a line drawn between a check node and a variable node indicates that information in the variable node is used to compute a value to be stored in the check node. A check node contains information corresponding to a modulo two sum of all variable nodes to which the check node is connected. Accordingly, the check node 204 is connected to the variable nodes 222, 224, and 226, and the check node 204 contains a modulo two sum of information stored in the variable nodes 222, 224, and 226. Accordingly, the bipartite graph 200 is a graphical representation of the LDPC matrix 150 and the LDPC scheme 100. In the example depicted in FIGS. 1 and 2, the LDPC code is a regular code, which means that each of the check nodes is connected to the same number of variable nodes as each of the other check nodes, and each of the variables nodes is connected to the same number of check nodes as each of the other variable nodes. In other examples, LDPC codes can be irregular and do not conform to these stipulations.

FIG. 3 depicts two subsets of a bipartite graph, each subset representing updating performed in bit-flipping decoding using a LDPC code. FIG. 3 includes a variable node update 300 and a check node update 350. The variable node update 300 includes four check nodes 302, 304, 306, and 308, each connected to a variable node 310. The subset 300 of a bipartite graph depicts a process in which information stored in the check nodes 302, 304, 306, and 308 is used to update information stored in the variable node 310. In some examples, each of the check nodes contains a bit. The value of this bit corresponds to whether the parity check equation associated with the check node is satisfied. As described herein, if a check node is satisfied, its parity equation is satisfied, and sums to zero modulo two. If a check node is unsatisfied, its parity check equation is unsatisfied and sums to one modulo two. Other types of parity may be used, and a satisfied parity check equation may sum to one modulo two. A parity check resulting in a satisfied check node may be referred to as a successful parity check.

A bit-flipping decoder can determine whether the variable node 310 contains an error by processing each of the connected check nodes 302, 304, 306, and 308. Processing may include computing parity according to the associated parity check equation and thus determining whether each check node is satisfied or unsatisfied. The bit-flipping decoder can then determine whether to flip one or more bits contained in the variable node 310 by comparing the number of unsatisfied connected check nodes to a threshold. The threshold may be a predetermined number, and the threshold can change from node to node and from iteration to iteration. In one example, the threshold is two. In this example, if two or more check nodes connected to the variable node 310 are unsatisfied, one or more bits contained in the variable node 310 will be flipped. As used herein, flipping a bit refers to changing the value of the bit, and flipping a variable node refers to changing values of bits in the variable node. If the value of a bit is zero, flipping the bit will change the value of the bit to one. Conversely, if the value of the bit is one, flipping the bit will change the value of the bit to zero.

The value of the threshold used by a bit-flipping decoder can be as small as zero and as large as the degree of the node in question. As used herein, a node's degree is the number of nodes connected to the node. In the example depicted in 300, the variable node 310 has a degree of four. By comparing the number of unsatisfied connected check nodes to a threshold, the bit-flipping decoder can determine whether a variable bit contains an error. This process can be repeated for each variable node and a bipartite graph corresponding to an LDPC scheme.

FIG. 3 also depicts a subset 350 of a bipartite graph representing updating of a check node. The subset 350 includes a check node 352 and variable nodes 354, 356, 358, and 360. The check node 352 contains information corresponding to a result of a parity check equation associated with the check node 352. The value stored in the check node 352 is determined by computing a modulo two sum of values stored in the connected variable nodes 354, 356, 358, and 360, as described previously with respect to FIGS. 1 and 2. By performing a parity check on information contained in the connected variable nodes 354, 356, 358, and 360, the bit-flipping decoder can store parity information in the corresponding check node 352.

Bit-flipping decoders can operate iteratively. Accordingly, after an iterative decoder has performed a first iteration, including updating a check node as depicted in 350 and updating a variable node as depicted in 300, the iterative decoder can perform a second iteration, including a second check node update followed by a second variable node update. The iterative decoder may continue to iterate in this manner until one or more criteria are met. These criteria may include convergence criteria which terminate iteration when the values of all check nodes are zeros, and the criteria can also include terminating the iteration after a fixed number of iterations.

Figure 4:
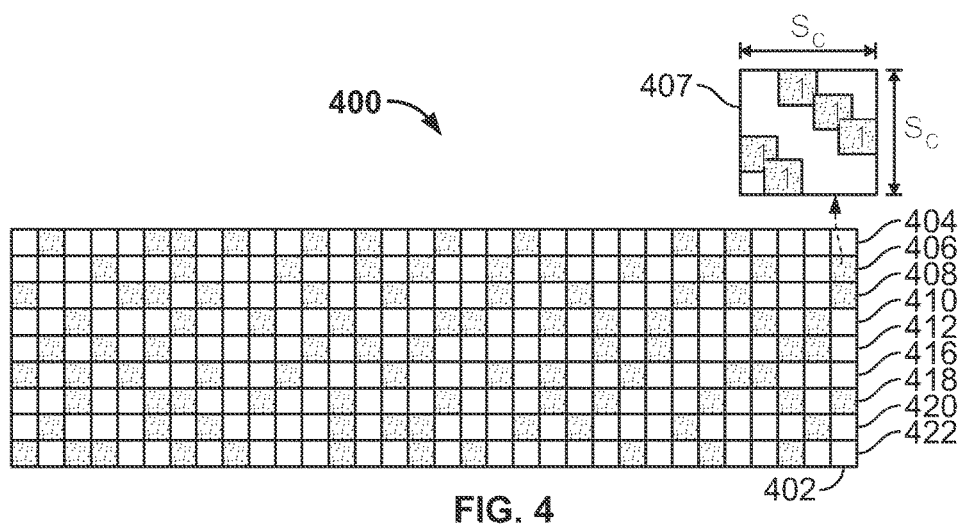
FIG. 4 depicts an LDPC parity check matrix structured in block-circulant form, according to an implementation of this disclosure.

FIG. 4 depicts an LDPC parity check matrix 400 structured in block-circulant form. Each block of the matrix 400 is a binary circulant sub-matrix containing ones and zeros as elements of the circulant sub-matrix. The matrix 400 includes nine block rows 404, 406, 408, 410, 412, 416, 418, 420, and 422. The matrix 400 also includes 32 block columns. Accordingly, each block row of the matrix 400 contains 32 blocks. The block 407 is the right-most block of the block row 406. The block 407 is a circulant sub-matrix, with each row a cyclic permutation of the previous row. The block 407 contains two minor diagonals of ones, and other elements in the block 407 are zeros. A size $S_c$ of the block 407 denotes the number of rows in the block and also the number of columns in the block. Hence, block 407 is a square block in this example. In other examples, blocks can have a number of rows that is different from a number of columns. The size $S_c$ can be large, and in some examples, $S_c$ equals 100. Since the block 407 contains some ones, the block 407 is shaded and the representation of the matrix 400 depicted in FIG. 4. Blocks of the matrix 400 that are not shaded do not contain ones. Since the total number of zeros in the matrix 400 is large compared to the total number of ones in the matrix 400, the matrix 400 is referred to as a low-density matrix. Each block row of the matrix 400 corresponds to a group of check nodes. Each block column of the matrix 400 corresponds to a group of variable nodes.

Active blocks of the matrix 400 are blocks with non-zero elements. Accordingly, there are three active blocks in block column 402, the right most block column of the matrix 400. An active block in a particular block row and block column of the matrix 400 indicates that the check node associated with the particular row plays a role in determining whether to flip values of one or more bits associated with the particular column. Accordingly, when determining whether to flip values of one or more bits associated with the block column 402, the three active blocks (associated with rows 406, 408, and 418) will be processed.

Figure 5:
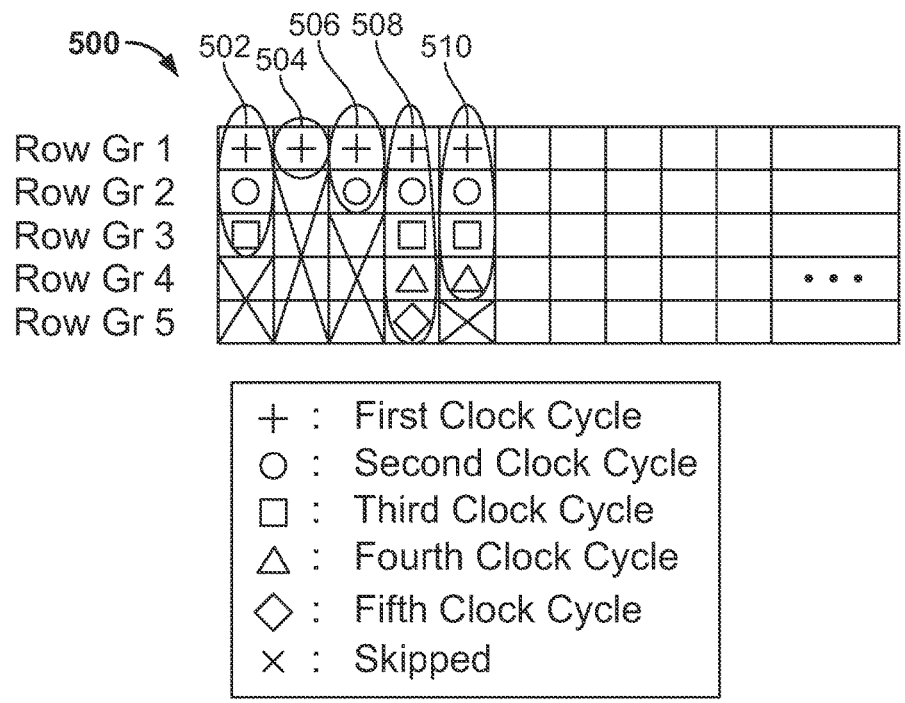
FIG. 5 depicts a parity check matrix used in partial-column processing, according to an implementation of this disclosure.

FIG. 5 depicts a parity check matrix 500 used in partial-column processing. The matrix 500 may be a low density block-circulant matrix, with many blocks having only zeroes as elements. The parity check matrix 500 includes five columns, 502, 504, 506, 508, and 510. As described herein, each of the columns of the matrix 500 is associated with a group of variable nodes, and each of the rows of the matrix 500 is associated with a group of check nodes. FIG. 5 depicts the processing of part of the matrix 500 over five clock cycles of a decoder performing the processing. The matrix 500 may have more than five columns, but for simplicity of presentation, only the processing of the first five columns is depicted. A decoder processing the matrix 500 processes the first element in each of the first five columns during the decoder's first clock cycle.

After the first clock cycle, the decoder determines that none of the values stored in variable nodes associated with the block column 504 will be flipped, even if the remaining parity checks in column 504 are unsatisfied. Thus, the decoder determines to skip the remaining blocks of the column 504. However, the decoder cannot yet determine whether values of variable nodes associated with columns 502, 506, 508, and 510 will be flipped after the first clock cycle. Accordingly, the decoder determines to continue processing columns 502, 506, 508, and 510.

In a second clock cycle of the decoder, the decoder processes the second elements in each of columns 502, 506, 508, and 510. The decoder may also process another element in another column, but this is not depicted in FIG. 5 for simplicity of illustration. After the second clock cycle, the decoder determines that even if the remaining three blocks of the column 506 were to be processed in subsequent clock cycles, none of the values of variable nodes associated with the column 506 would be flipped, and there would be no benefit from processing the column 506 further. Accordingly, after the second clock cycle, the decoder determines to skip the remaining blocks of the column 506.

The decoder makes a similar determination for column 502 after the third clock cycle and for column 510 after the fourth clock cycle. However, the decoder cannot make such a determination for column 508, and must continue to process the entire column until the column is completed. For the columns containing skipped blocks, the decoder realizes an increase in performance, since processing of the column was completed faster than processing the full column. In this example, five blocks are processed in each clock cycle, but other numbers of blocks may be processed in each clock cycle.

The decoder may make a determination to skip remaining blocks in a column by comparing a number of unsatisfied checks in the column to a threshold. The decoder may assign a threshold $t_j$ to each column of the decoder. The threshold $t_j$ for each column may be different. The threshold $t_j$ for a column is the minimum number of unsatisfied checks for the column required to flip the bit or bits (variable node) associated with the column. For example, if $t_j=4$ for a column, then four unsatisfied checks are required to flip the bit or bits (variable node) associated with the column. In this example, if only three checks are unsatisfied, value of the variable node will not be flipped. If the column 506 has a threshold $t_j=4$, and after the second clock cycle, both checks in the column 506 are satisfied for all variable nodes corresponding to the block colum 506, the decoder can determine that even if the three remaining checks are unsatisfied for some variable nodes in the block column 506, the variable nodes corresponding to column 506 would at most have three unsatisfied checks. Since the number of unsatisfied checks, three, is lower than the threshold $t_j=4$ for the column 506, the decoder can determine that there is no benefit from continuing to process the remaining elements of the column 506, since there will be no possible outcome in which the threshold is met or exceeded. Accordingly, the decoder determines to skip the remaining elements of the column 506 after the second clock cycle.

Thresholds may be different for different columns, and if the column 508 has a threshold $t_j=1$, then all five blocks of the column 508 must be processed, since only one unsatisfied check could cause the associated variable node to flip. The decoder can determine to continue processing a column if there are unsatisfied checks. For example, if the column 502 has a threshold of $t_j=4$, and the parity check computed during the first clock cycle was unsatisfied for at least some check nodes in the block, then the decoder must continue to process at least two more blocks of the column 502 before determining that further processing, regardless of the outcome of the processing, will not cause the variable node to be flipped.

To determine whether remaining blocks associated with a variable node can be skipped, the decoder makes the following determinations. First, the decoder determines a number of unsatisfied checks for a variable node. These unsatisfied checks are parity checks for blocks associated with the variable node, computed during a same iteration, which the decoder determines to be unsatisfied. Next, the decoder determines a number of remaining unprocessed blocks associated with the variable node. These remaining unprocessed blocks are blocks for which a parity computation has not been performed during the same iteration. Next, the decoder determines a threshold $t_j$ for the variable node and associated with the same iteration. This threshold may be different for different variable nodes during the same iteration, and the threshold may be different for the same variable node during different iterations. Then, the decoder compares a sum of the number of unsatisfied parity checks and the number of remaining unprocessed blocks to the threshold $t_j$. The threshold $t_j$ can represent either a number of unsatisfied parity checks required to flip the variable node, or a number of satisfied parity checks required to ensure that the variable node will not be flipped during the iteration. If the threshold represents the number of unsatisfied parity checks required to flip the variable node, then comparing the sum to the threshold involves determining whether the sum meets or exceeds the threshold. If the sum meets or exceeds the threshold, then the decoder cannot determine at this clock cycle, whether the variable node will not be flipped and the decoder must continue processing at least one additional block of the remaining unprocessed blocks.

If, however, the sum does not meet or exceed the threshold, then a sufficient number of checks have been satisfied and the variable node will not be flipped.

If, based on the comparison of the sum to the threshold, the decoder determines that the variable node cannot be flipped during this iteration even if all of the remaining unprocessed parity checks, if processed, were to be unsatisfied, the decoder can determine to skip the remaining unprocessed blocks for the variable node. In this situation, the decoder has an improved throughput, because the decoder processes a reduced number of blocks for the iteration.

If, based on comparing the sum to the threshold, the decoder cannot determine whether the variable node will be flipped if parity checks for all of the remaining unprocessed blocks are to be unsatisfied, the decoder cannot determine at this clock cycle to skip the remaining unprocessed blocks, but instead must continue to process at least one additional remaining unprocessed block. After processing additional blocks, but before processing all of the remaining unprocessed blocks, the decoder may again compare a new sum to the threshold to determine if further processing is necessary.

If each block of the parity check matrix 500 includes multiple bits, the decoder may use either a hard approach or a soft approach to determine whether to continue processing blocks for the variable node. In a hard approach, the decoder will make a strict comparison. If the decoder determines that any of the bits of the variable node may be flipped, the decoder must continue to process additional blocks for the variable node until the decoder determines that none of the bits in the variable node will be flipped in the iteration.

In a soft approach, the decoder can improve throughput by accepting a risk that some bits may incorrectly be left unflipped. In a soft approach, a decoder may determine after processing some but not all blocks for the variable node that a large fraction of bits of the variable node will not require flipping, even if parity checks for all of the remaining unprocessed blocks are to be unsatisfied. However, since the decoder cannot make this determination for the remaining fraction of the bits without processing further blocks for the variable node, there remains a possibility that some of the small fraction of bits may be flipped, depending on the outcome of parity checks for the remaining unprocessed blocks. In some situations, the likelihood of these remaining bits of the small fraction also requiring flipping is low, especially if a large fraction of bits can be determined not to require flipping. A soft approach can take advantage of this low likelihood by applying a weighting based on the fraction of bits that can be determined not to require flipping. The decoder may compare this weighting to a second threshold to determine whether to continue processing blocks for the variable node.

Skipping processing in this example, while increasing decoder throughput, can result in sub-optimal decoding. In some situations, the risk of these errors is outweighed by the increase in decoder performance (measured in throughput, power consumption, and/or footprint).

The threshold $t_j$ can be a predetermined quantity. The threshold $t_j$ can also be determined during each iteration for each variable node. The decoder can determine a new value for $t_j$ after processing additional blocks for the variable node during a same iteration. The threshold $t_j$ may be same or may be different from bit to bit within bits of a block column. Systems and methods for determining the threshold $t_j$ are described in U.S. patent application Ser. No. 13/673,371, filed Nov. 9, 2012, the entire contents of which are hereby incorporated by reference.

The decoder can determine $t_j$ based on whether the variable node has been flipped from its original value during the current or a prior iteration. One way to determine whether a variable node has been flipped from its original value is to check, on a bit-by-bit level, whether bits of the variable node have been flipped. In this approach, the memory containing this information is accessed M times per clock cycle, where M represents a number of active variable nodes processed during the clock cycle. This approach requires a larger amount of memory to implement, but the decoder can use a different threshold to check each bit of the block column.

In another approach, the decoder can determine whether the variable node has been flipped from its original value by checking whether any bit in the variable node has been flipped. This approach requires a smaller amount of memory to implement, but the decoder uses the same threshold for all bits of the variable node.

Figure 6:
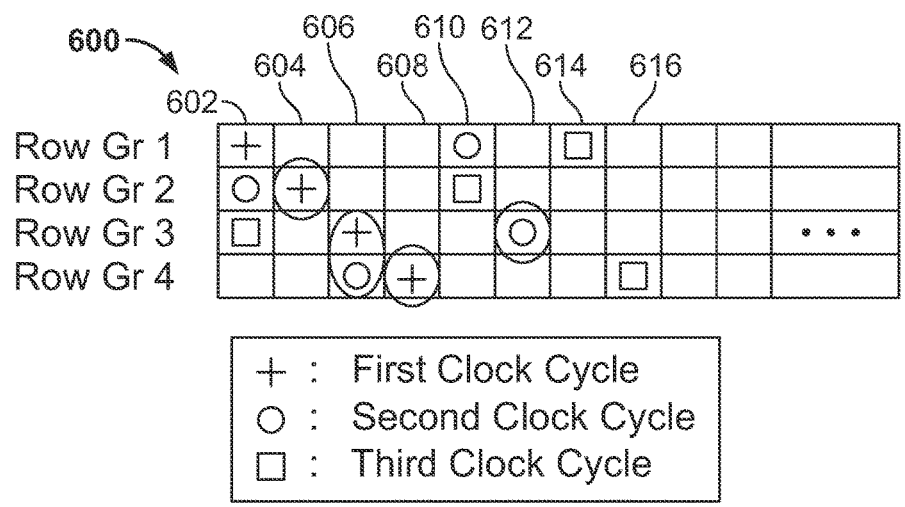
FIG. 6 depicts dynamic processing of blocks in a parity check matrix, according to an implementation of this disclosure.

FIG. 6 depicts dynamic processing of blocks in a parity check matrix 600. The matrix 600 may be a low density block-circulant matrix, with many blocks having only zeros as elements. The parity check matrix 600 includes four rows and eight columns 602, 604, 606, 608, 610, 612, 614, and 616. The parity check matrix 600 also includes additional columns. Since each row of the parity check matrix 600 is associated with a check node, conflicts in the decoder may arise if the decoder computes a parity check for blocks in the same row of the parity check matrix during a same clock cycle. These conflicts may arise because the decoder computes parity checks on data associated with different variable nodes but the same check node. The decoder may avoid these conflicts by selecting blocks for processing such that blocks processed during a same clock cycle are in different rows of the parity check matrix 600.

FIG. 6 depicts a situation in which the decoder has processed, during a first clock cycle, blocks in different rows of each of columns 602, 604, 606, and 608. In FIG. 6, circled elements indicate that the decoder has determined that further processing for blocks of variable nodes is not necessary, based on a determination that even if parity checks for all of the remaining unprocessed blocks of the variable nodes were to be unsatisfied, the variable node will not be flipped. Thus, after the first clock cycle in FIG. 6, the decoder has determined that further processing is not necessary for the columns 604 and 608. FIG. 6 depicts that during a second clock cycle, the decoder processes blocks in columns 602, 606, 610, and 612. The decoder selects blocks in different rows to avoid conflicts. After the second clock cycle, the decoder determines that further processing of blocks in the column 606 is not necessary. However, the decoder has determined that further processing is required for the column 602. FIG. 6 depicts that in a third clock cycle, the decoder processes blocks in columns 602, 610, 614, and 616. In this way, the decoder has determined after only two clock cycles that the variable nodes associated with columns 604, 606, 608, and 612 do not require flipping. This represents a throughput increase for the decoder over situations in which processing of all blocks in these columns is required to make the determination.

The decoder can select which blocks to process dynamically or semi-deterministically. In a semi-deterministic approach, the decoder selects blocks for processing based on one or more rules. These rules may include selecting blocks nearest certain locations in the parity check matrix 600. For example, the decoder may select a next active column nearest either the left edge or the right edge of the parity check matrix 600. The decoder may select a next active block of a next active column that is nearest the top or bottom edges of the parity check matrix 600. In some implementations, the decoder further selects blocks for processing that reside in different rows. In some examples, the decoder selects blocks for processing that reside in a same row.

In some examples, the decoder can dynamically select blocks for processing. In these examples, the decoder selects the next block to process based on a history. This history can include results of previous parity checks during the same iteration, and the history can include results of parity checks in prior iterations.

Figure 7:
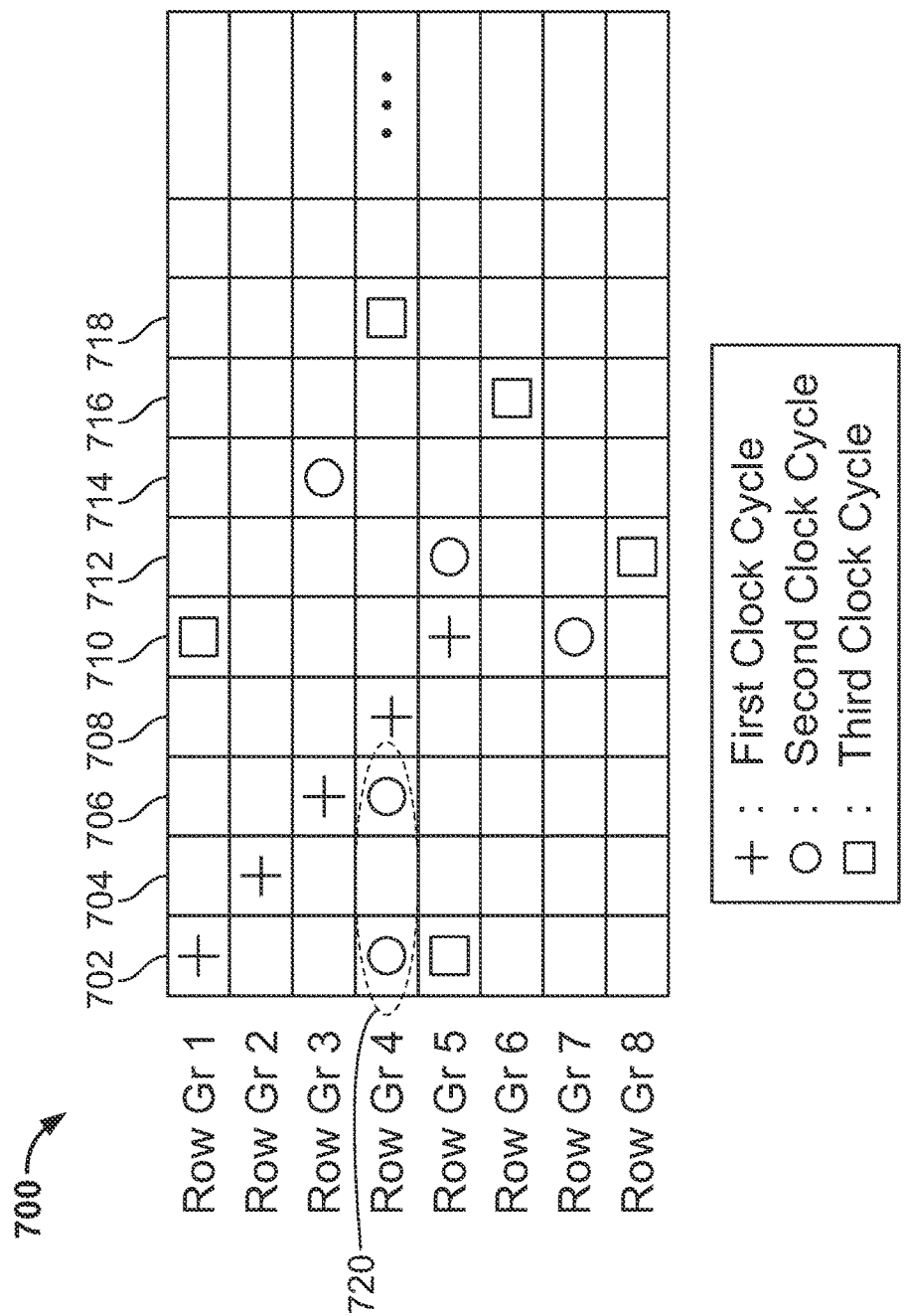
FIG. 7 depicts a situation in which a decoder performs dynamic selection of blocks in a parity check matrix, according to an implementation of this disclosure.

FIG. 7 depicts a situation in which a decoder performs dynamic selection of blocks in a parity check matrix 700. The matrix 700 may be a low density block-circulant matrix, with many blocks having only zeroes as elements. The parity check matrix 700 includes columns 702, 704, 706, 708, 710, 712, 714, 716, and 718. The parity check matrix 700 also includes additional columns. The parity check matrix also includes eight rows. FIG. 7 depicts a situation in which the decoder has selected blocks for processing during a first clock cycle using a semi-deterministic set of rules. These rules include selecting five left-most and upper-most blocks, each of the five selected blocks for residing in a different row than the other selected blocks. During a second clock cycle, the decoder dynamically selects blocks for processing based on results of parity checks of the first clock cycle. The decoder may also dynamically select blocks for processing during the second clock cycle based on results from previous iterations. During a third clock cycle, the decoder dynamically selects blocks for processing based on results from the first and second clock cycles and/or based on results from previous iterations.

FIG. 7 also depicts a conflict 720. The conflict 720 has arisen since the decoder selected to process two blocks in the same row group for during the second clock cycle. Since the conflict 720 results from the decoder processing two blocks in row group 4, the decoder is simultaneously processing blocks associated with the same check node during the same clock cycle. Some hardware architectures are configured to process conflicts such as the conflict 720. However, some architectures are not configured to process conflicts such as the conflict 720, and in these architectures, the decoder must select blocks for processing to minimize or eliminate conflicts.

The decoder requires storage to store an intermediate number of unsatisfied checks for each active variable node. Active variable nodes are variable nodes with remaining unprocessed blocks and for which a determination has not been made that further processing will not cause the variable node to be flipped. The size of storage required is a product $S_c \times M \times K$, where $S_c$ is a block size. M is a number of active variable nodes, and K is a size of memory need to store the number of unsatisfied parity checks. Each column may be associated with a different value of K.

Furthermore, a pipeline delay may require a larger amount of storage. In these examples, the decoder may determine to flip multiple variable nodes during a same iteration and during a same clock cycle. In some architectures, the decoder cannot flip multiple variable nodes during a same clock cycle, and thus must use a buffer to store parity check results until a future clock cycle during which the decoder can flip the variable node.

As part of selecting blocks for processing, the decoder must store information regarding the locations of currently active columns. In an example, the decoder stores in a buffer the current lowest column index. In this example, the decoder also stores in the buffer a delta for each of the other active columns which indicates a relative position from the column indicated by the lowest column index. In the example depicted in FIG. 6, during the third clock cycle, the lowest column index is zero, and the deltas are 4, 6, and 7. In another example, the decoder stores the locations of the active block columns by storing an absolute index for each active column.

The decoder also stores information regarding the number of processed blocks and each of the active block columns. In the example depicted in FIG. 6, after the third clock cycle, this number is three for the column 602, two for the column 610, one for the column 614, and one for the column 616.

The decoder also stores information corresponding to the number of unsatisfied checks in each active block column. The decoder can do this by storing either a number corresponding to the number of unsatisfied checks in the column, or a number corresponding to the number of satisfied checks in the column.

A hard decision memory contains values for bits of one or more variable nodes. When the decoder determines to flip a variable node, the decoder performs a read-modify-write process on the hard decision memory. This read-modify-write process includes the decoder reading one or more values from the hard decision memory, modifying the one or more values of the hard decision memory, and writing the modified value back to the hard decision memory to replace the read one or more values. If, during a clock cycle, the decoder determines that multiple variable nodes should be flipped, the decoder will perform this read-modify-write process for locations in the hard decision memory corresponding to each of the variable nodes to be flipped. Since the decoder can process blocks associated with multiple variable nodes during the same clock cycle, the decoder can determine that multiple variable nodes must be flipped during the same clock cycle. The decoder can perform a read-modify-write process on one or more variable nodes during a clock cycle and store information regarding the remaining bits to be flipped in a buffer or flipping during subsequent clock cycles. This buffer can be a first-in-first-out (FIFO) buffer. In other implementations, this buffer can be another type of buffer.

Since the decoder can process M blocks during a clock cycle, a buffer of the size $M \times S_c$ bits is the maximum necessary size of this buffer, where $S_c$ is size of a block. A buffer of this maximum necessary size can store information regarding each of the bits to be flipped, if the variable nodes for all M blocks processed during a clock cycle require flipping. Since, in some examples, the buffer storing information regarding bits to be flipped in future clock cycles will not be filled, the size of the buffer can be reduced to a size less than $M \times S_c$ bits. If the size of the buffer is reduced below $M \times S_c$ bits and if the decoder determines that a large number of columns require flipping during a same clock cycle, the buffer may not have the capacity to store this information for all of the columns requiring a flip. In this situation, one or more columns requiring a flip may not be flipped. This can result in a loss of performance, but has the benefit of reducing the size of the buffer.

Similar buffers may be used to store information regarding whether bits of a variable node have been flipped in previous iterations. This information can be used to determine a threshold $t_j$, as described herein.

In some examples, the decoder processes multiple blocks per column during a same clock cycle. In these examples, the size of the memory required to store the intermediate number of unsatisfied checks for each variable node is reduced. While the size of the memory is reduced in these examples, the performance gains from partial column processing are also reduced. This can occur if processing of only one of the blocks in a column would have provided sufficient information for the decoder to determine that the remaining blocks would not affect the outcome and thus do not require processing. However, in these examples, the decoder processes multiple blocks of a column during a clock cycle, when only one block was necessary.

In some examples, the decoder processes less than a full block per column per clock cycle. This may result in increased throughput, but can require more memory to store the intermediate number of unsatisfied checks for each column.

An encoding scheme determines the transmitted parity bits and the parity check matrix for a set of encoded data. The code can be designed to accommodate hardware requirements of the decoder. For example, if a particular decoder cannot accommodate conflicts, the code can be designed to reduce or eliminate the number of conflicts in a parity check matrix to accommodate the requirements of the decoder. An intelligent state machine can also be used during decoding to select blocks such that conflicts are minimized. In some examples, code design and an intelligent state machine are used in conjunction to reduce or eliminate conflicts in decoding. Blocks can become "idle" due to a conflict. For example, if a decoder determines to process only one block involved in a conflict, the other block is idle during the clock cycle.

An intelligent state machine can make several determinations to minimize conflicts and idle blocks. First, if the intelligent state machine determines that the decoder should continue to process blocks in the column, the intelligent state machine can select a next block in the column to process. Then, if the intelligent state machine determines to skip the remaining unprocessed blocks in the column the intelligent state machine then selects a next column for processing. Then, the intelligent state machine selects a block within the selected column for processing. The intelligent state machine makes each of these three selections such that conflicts between blocks are minimized.

Several approaches for selecting blocks to minimize conflicts involve staggering selected blocks within the parity check matrix. In these staggered approaches, the decoder selects a block for each active column such that there is no conflict with previously-selected columns for the clock cycle. However the decoder does not take into account factors regarding yet-to-be-selected block columns for the clock cycle.

In a first approach, the decoder selects each of the active columns to be processed in the order the columns are stored in a buffer, and select blocks of the parity check matrix such that the upper most unprocessed block in the first active column is selected. The decoder then selects, for the second active column, the upper most block that is not in the same row as the selected block of the first column. The decoder continues for each of the next active columns, selecting, for each column, the upper most block that is not in a row of a previously-selected block. In this way, the decoder can stagger active blocks to minimize conflicts.

In a second approach, the decoder ranks active columns according to the number of processed blocks and each active column. In some examples, this ranking is performed in descending order of number of processed blocks such that a column with more processed blocks than any other active column is ranked highest. In these examples, the decoder selects a block for the highest-ranked column first. Then, the decoder selects a block for the next-highest-ranked column such that the block for the second column does not conflict with the selected block for the first column. The decoder then continues for each of the remaining columns in order of column rank.

In a third approach, a hybrid ranking is used by the decoder to select columns for processing. The decoder can select a threshold X and place columns with more than X processed circulants in a first set of columns. The decoder can place the remaining active columns in a second set. The decoder can then select active blocks for columns in the first set using a staggered approach, such as the first approach described herein. The decoder can then select active blocks to be processed from columns in the second set using a staggered approach, such as the first approach described herein. Using these approaches described herein, the decoder can select active blocks for processing to minimize or reduce conflicts.

Figure 8:
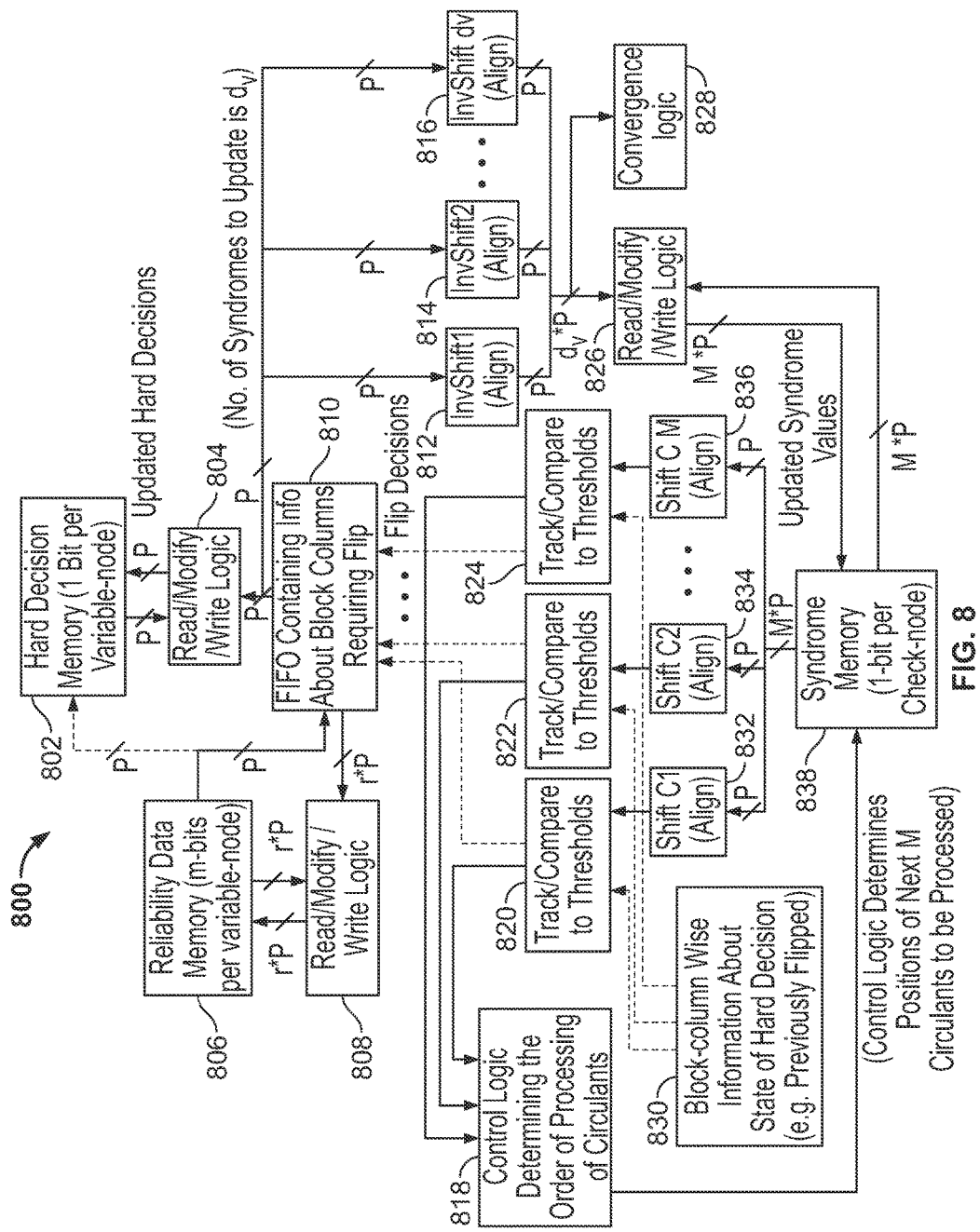
FIG. 8 depicts an architecture of a system configured to implement partial processing of columns of a parity check, according to an implementation of this disclosure.

FIG. 8 depicts an architecture of a system 800 configured to implement partial processing of columns of a parity check matrix. The system 800 includes a hard decision memory 802, and read-modify-write logic 804 for the hard decision memory 802. The hard decision memory 802 has a size of one bit per variable node. The read-modify-write logic 804, as described herein, can perform flipping of the variable node by modifying the information stored in the hard decision memory 802. The system 800 includes a reliability data memory 806, and read-modify-write logic 808 for the reliability data memory 806. The reliability data memory 806 may have a size of m bits per variable node. The system 800 includes a buffer 810 containing information regarding nodes determined to require flipping, as described herein.

The system 800 includes shift modules 812, 814, and 816 to perform alignment of columns for storage of bit values, read-modify-write logic 826, convergence logic 828 and the syndrome or check node memory 838. The check node memory 838 has a size of one bit per check node. The system 800 includes shift modules 832, 834, and 836 to perform alignment of column values prior to comparison to thresholds. The system 800 includes threshold comparison modules 820, 822, and 824 to perform comparison of an intermediate number of unsatisfied checks for each column to a threshold for each column, as described herein. The comparison modules 820, 822, and 824 each stored information regarding an intermediate number of unsatisfied checks for each active column and are used by the decoder to determine whether to skip remaining unprocessed blocks in the column. A system 800 includes a control logic 818 to determine an order of blocks to be processed and to select next blocks and columns for processing. The system 800 also includes a memory 830 to store information regarding the state of the hard decision memory 802 for each block column. The memory 830 can store information regarding whether each variable node has changed from its original value. The system 800 can include additional modules, depending on the size of M, the number of blocks processed during each clock cycle. For example, instead of the three shift module 812, 814, and 816 depicted in FIG. 8, the system 800 can include five shift modules for a configuration in which M equals five. Similarly, the system 800 can include a different number of comparison modules. In this way, the system 800 can implement partial column processing of a parity check matrix.

Figure 9:
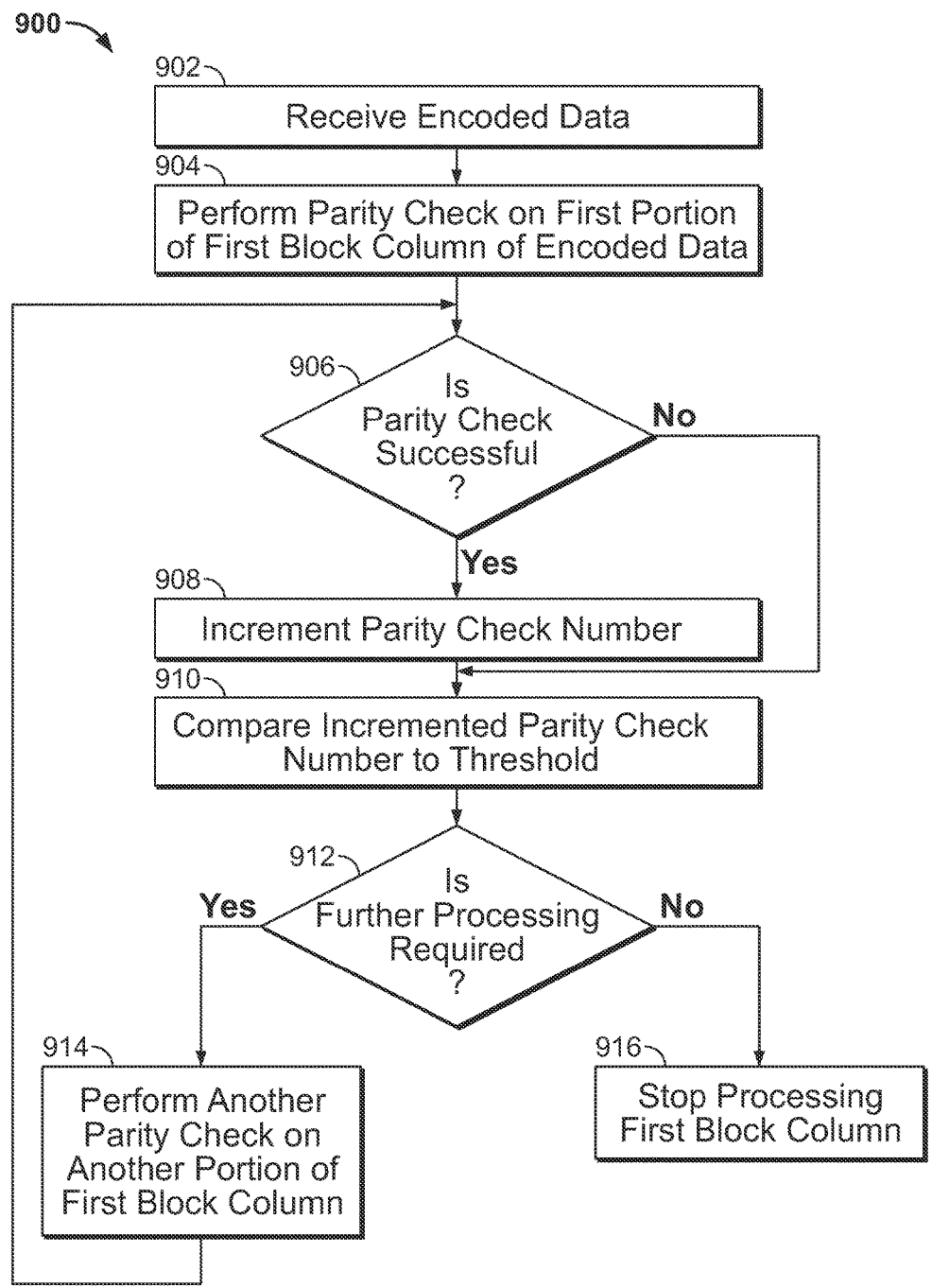
FIG. 9 depicts a process for performing partial column processing of a parity check matrix, according to an implementation of this disclosure.

FIG. 9 depicts a process 900 for performing partial column processing of a parity check matrix. At 902, the decoder receives encoded data. For example, this encoded data may be the set of variables 102.

At 904, the decoder performs a parity check on a first portion of a first block column of a parity check matrix for the encoded data. For example, the parity check matrix may be one or more of the matrices 150, 400, 500, 600, and 700. Performing a parity check may include updating nodes of one or more of the bipartite graphs 200, 300, and 350.

At 906, the decoder determines whether the parity check was successful. Determining whether the parity check was successful can include determining whether parity was satisfied for the first portion. For example, determining whether the parity check was successful can include comparing the result of an XOR or addition modulo two operation to a predetermined value such as zero or one as described herein.

If the parity check was successful, at 908, the decoder increments a parity check number. For example, the incremented parity check number can include information about a number of satisfied parity checks or a number of unsatisfied parity checks for the first block column, as described herein.

At 910, the decoder compares the incremented parity check number to a threshold. For example, the threshold may be $t_j$ as described herein. For example, comparing the incremented parity check number to a threshold can include comparing an intermediate number of unsatisfied parity checks to the threshold, as described herein. This comparison may be implemented by one or more of the comparison modules 820, 822, and 824. For example, comparing the incremented parity check number to a threshold can include comparing a sum of a number of unsatisfied parity checks for the block column and a number of remaining unprocessed blocks for the block column to a threshold.

At 912, the decoder determines whether further processing is required. For example, this can be implemented by the control logic 818, as described herein.

At 914, if further processing is required, the decoder performs another parity check on another portion of the first block column. For example, this parity check may be based on one or more of the matrices 150, 400, 500, 600, and 700. Performing a parity check may include updating nodes of one or more of the bipartite graphs 200, 300, and 350.

At 916, if further processing is not required, the decoder stops processing the first block column, skipping any remaining unprocessed blocks in the first block column. In this way, the decoder can skip portions of block columns for which further processing is not required, thereby improving performance of the decoder. For example, this skipping can be performed by the control logic 818, as described herein.

Figure 10:
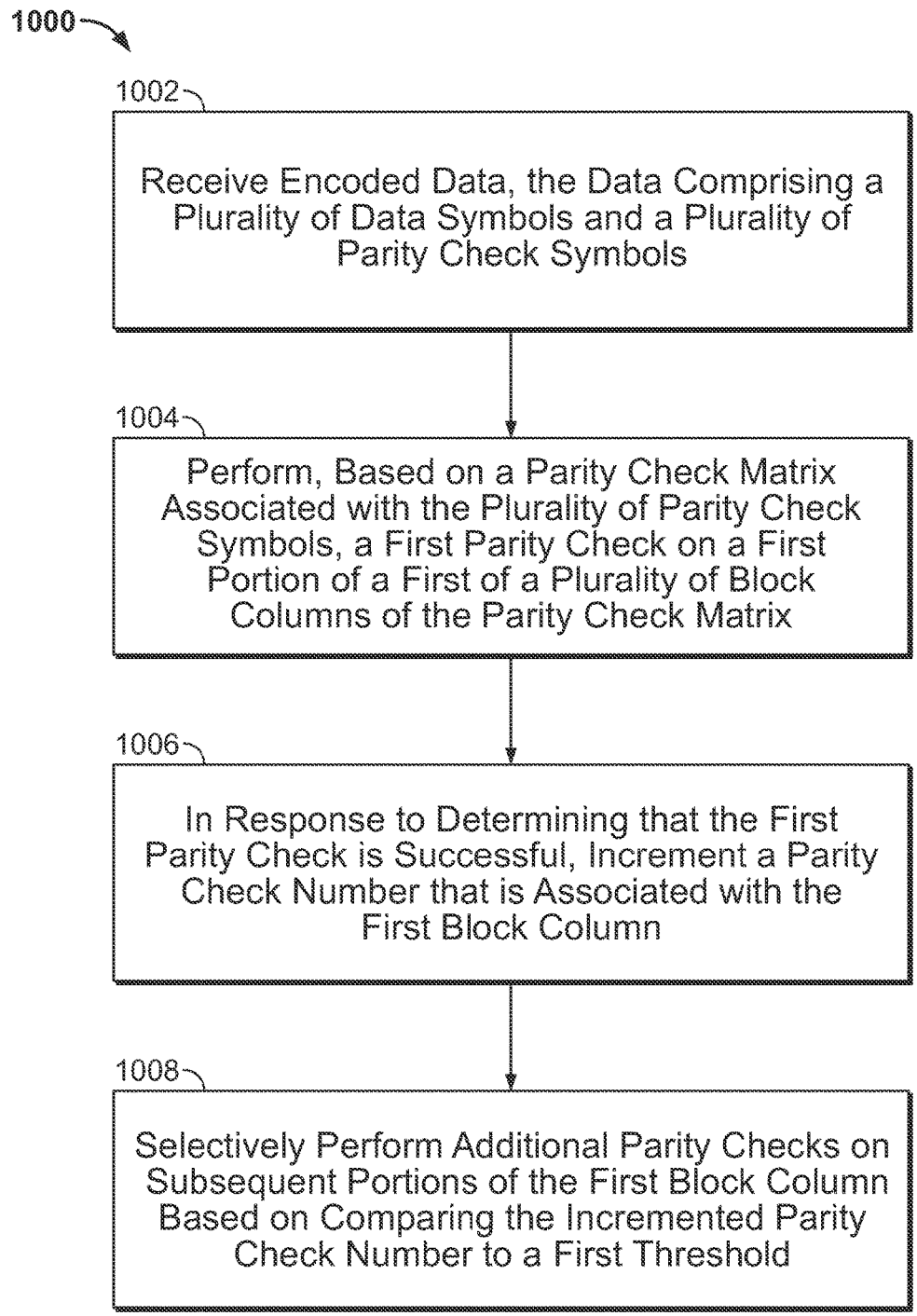
FIG. 10 depicts a process for performing partial column processing of parity check matrices, according to an implementation of this disclosure.

FIG. 10 depicts a process 1000 for performing partial column processing of parity check matrices. At 1002, encoded data is received, the data comprising a plurality of data symbols and a plurality of parity check symbols. For example, this encoded data may be the set of variables 102.

At 1004, a first parity check is performed on a first portion of a first of a plurality of block columns of the parity check matrix. The first parity check is performed based on a parity check matrix associated with the plurality of parity check symbols. For example, this parity check may be based on one or more of the matrices 150, 400, 500, 600, and 700. Performing a parity check may include updating nodes of one or more of the bipartite graphs 200, 300, and 350.

At 1006, in response to determining that the first parity check is successful, a parity check number is incremented. The parity check number is associated with the first block column. For example, the incremented parity check number can include information about a number of satisfied parity checks or a number of unsatisfied parity checks for the first block column, as described herein.

At 1008, additional parity checks are selectively performed on subsequent portions of the first block based on comparing the incremented parity check number to a first threshold. For example, this selective performing can be performed by the control logic 818, as described herein. In this way, partial block columns of a parity check matrix can be processed.

As described herein, block columns of a parity check matrix are associated with variable nodes of a bipartite graph. However, in some examples, block columns of a parity check matrix may be associated with check nodes of a bipartite graph, and block rows of the parity check matrix may be associated with variable nodes of the bipartite graph. In these examples, the systems and methods described herein can perform partial row processing of block rows of the parity check matrix.

The foregoing describes methods and an apparatus for decoding data. The above-described embodiments of the present disclosure are presented for the purposes of illustration and not of limitation. Furthermore, the present disclosure is not limited to a particular implementation. For example, one or more steps of methods described above may be performed in a different order (or concurrently) and still achieve desirable results. In addition, the disclosure may be implemented in hardware, such as on an application-specific integrated circuit (ASIC) or on a field-programmable gate array (FPGA). The disclosure may also be implemented in software by, for example, encoding instructions for performing the process discussed above in transitory or non-transitory computer readable medium with transitory or non-transitory computer readable instructions encoded thereon.

What is claimed is:

1. A method for performing a parity check on encoded data, the method comprising:

receiving the encoded data, the encoded data including a plurality of data symbols and a plurality of parity check symbols;

retrieving, from memory, a parity check matrix associated with the plurality of parity check symbols;

determining, using control circuitry, a first portion of an array of the received encoded data, the first portion having a dimension of the parity check matrix, on which to perform a parity check;

performing, based on the parity check matrix associated with the plurality of parity check symbols, a first parity check on the first portion;

in response to determining the first parity check is successful, adjusting a parity check number that is associated with the array;

selectively performing, using control circuitry, additional parity checks on subsequent portions of the array based on comparing the adjusted parity check number to a threshold;

in response to comparing the adjusted parity check number to the threshold, determining to perform the additional parity checks on subsequent portions of the array;

based on the additional parity checks, determining to change a value of a data symbol of the plurality of data symbols, the data symbol being associated with the array, wherein an indication that the value of the data symbol of the plurality of data symbols changed is stored in the memory; and in response to determining to change the value of the data symbol, storing an index corresponding to the array in a buffer.

2. The method of claim 1, wherein the array is a first array; and further comprising performing, during a same clock cycle as the first parity check, a second parity check on a second portion of a second array of the received encoded data, the second portion of the second array having the dimension of the parity check matrix, wherein the second array is different from the first array.

3. The method of claim 2, further comprising selecting the second portion of the second array such that a first check node associated with the first portion is different from a second check node associated with the second portion.

4. The method of claim 3, further comprising:
storing the adjusted parity check number in a first buffer;
performing a third parity check on a third portion of the first array;
in response to determining the third parity check is successful, incrementing the parity check number; and
storing the incremented parity check number in the first buffer.

5. The method of claim 4, further comprising:
storing, in a second buffer, indices corresponding to the first and second arrays;
storing, in a third buffer, first and second processed portion numbers;
incrementing the first processed portion number in response to performing the first parity check;
storing the incremented first processed portion number in the third buffer;
further incrementing the first processed portion number in response to performing the third parity check;
storing the further incremented first processed portion number in the third buffer;
incrementing the second processed portion number in response to performing the second parity check;
storing the incremented second processed portion number in the third buffer;
selecting, based on the stored indices and processed portion numbers, a fourth portion of a third array of the received encoded data, the fourth portion of the third array having the dimension of the parity check matrix; and
performing a fourth parity check on the selected fourth portion.

6. The method of claim 1, wherein the first portion is associated with a plurality of check nodes.

7. The method of claim 1, wherein the array is a first array and selectively performing additional parity checks comprises:
in response to comparing the adjusted parity check number to the threshold, determining not to perform the additional parity checks on subsequent portions of the first array; and
in response to comparing the adjusted parity check number to the threshold, determining not to change a value of another data symbol of the plurality of data symbols, the data symbol being associated with the first array.

8. The method of claim 7, wherein the threshold is a first threshold and further comprising performing a decoding iteration comprising:
storing, in a first buffer, information corresponding to whether the value has changed;
performing a second parity check on the first portion;
in response to determining the second parity check is successful, incrementing a second parity check number that is associated with the first array;
determining a second threshold based on the stored information; and
selectively performing the additional parity checks on subsequent portions of the first array based on comparing the incremented second parity check number to the determined second threshold.

9. The method of claim 7, wherein:
the threshold is a first threshold;
performing the first parity check comprises:
performing symbol-level parity checks on each of a plurality of symbols in the first data symbol,
for each successful symbol-level parity check, incrementing a symbol-level parity check number, and
comparing the symbol-level parity check number to a second threshold; and
determining that the first parity check is successful comprises:
in response to comparing the symbol-level parity check number to the second threshold, determining that the first parity check is successful.

10. A system for performing a parity check on encoded data, comprising:
control circuitry configured to:
receive the encoded data, the encoded data including a plurality of data symbols and a plurality of parity check symbols;
retrieve, from memory, a parity check matrix associated with the plurality of parity check symbols;
determine a first portion of an array of the received encoded data, the first portion of the array having a dimension of the parity check matrix, on which to perform a parity check;
perform, based on the parity check matrix associated with the plurality of parity check symbols, a first parity check on the first portion;
in response to determining the first parity check is successful, adjust a parity check number that is associated with the array;
selectively perform additional parity checks on subsequent portions of the array based on comparing the adjusted parity check number to a threshold;
in response to comparing the adjusted parity check number to the threshold, determine to perform the additional parity checks on subsequent portions of the array;
based on the additional parity checks, determine to change a value of a data symbol of the plurality of data symbols, the data symbol being associated with the array; and
in response to determining to change the value of the data symbol, store an index corresponding to the array in a buffer.

11. The system of claim 10, wherein the array is a first array and the control circuitry is further configured to perform, during a same clock cycle as the first parity check, a second parity check on a second portion of a second array of the received encoded data, the second portion of the second array having the dimension of the parity check matrix, wherein the second array is different from the first array.

12. The system of claim 11, wherein the control circuitry is further configured to select the second portion of the second array such that a first check node associated with the first portion is different from a second check node associated with the second portion.

13. The system of claim 12, wherein the control circuitry is configured to:
store the adjusted parity check number in a first buffer;

perform a third parity check on a third portion of the first array;

in response to determining the third parity check is successful, increment the parity check number; and store the incremented parity check number in the first buffer.

14. The system of claim 13, wherein the control circuitry is further configured to:

store, in a second buffer, indices corresponding to the first and second arrays;

store, in a third buffer, first and second processed portion numbers;

increment the first processed portion number in response to performing the first parity check;

store the incremented first processed portion number in the third buffer;

further increment the first processed portion number in response to performing the third parity check;

store the further incremented first processed portion number in the third buffer;

increment the second processed portion number in response to performing the second parity check;

store the incremented second processed portion number in the third buffer;

select, based on the stored indices and processed portion numbers, a fourth portion of a third array of the dimension; and perform a fourth parity check on the selected fourth portion.

15. The system of claim 10, wherein the first portion is associated with a plurality of check nodes.

16. The system of claim 10, wherein the array is a first array and the control circuitry is further configured to selectively perform additional parity checks by:

in response to comparing the adjusted parity check number to the threshold, determining not to perform the additional parity checks on subsequent portions of the first array; and in response to comparing the adjusted parity check number to the threshold, determining not to change a value of another data symbol of the plurality of data symbols, the data symbol being associated with the first array.

17. The system of claim 16, wherein the threshold is a first threshold and the control circuitry is further configured to perform a decoding iteration by:

storing, in a first buffer, information corresponding to whether the value has changed;

performing a second parity check on the first portion;

in response to determining the second parity check is successful, incrementing a second parity check number that is associated with the first array;

determining a second threshold based on the stored information; and selectively performing the additional parity checks on subsequent portions of the first array based on comparing the incremented second parity check number to the determined second threshold.

18. The system of claim 16, wherein the threshold is a first threshold and the control circuitry is further configured to:

perform the first parity check by:

performing symbol-level parity checks on each of a plurality of symbols in the first data symbol, for each successful symbol-level parity check, incrementing a symbol-level parity check number, and comparing the symbol-level parity check number to a second threshold; and determine that the first parity check is successful by:

in response to comparing the symbol-level parity check number to the second threshold, determining that the first parity check is successful.

* * * * *